(12) United States Patent
Lee et al.

(10) Patent No.: US 9,780,071 B2
(45) Date of Patent: Oct. 3, 2017

(54) STACKED SEMICONDUCTOR PACKAGE INCLUDING RECONFIGURABLE PACKAGE UNITS

(71) Applicant: SK hynix Inc., Icheon-si, Gyeonggi-do (KR)

(72) Inventors: Sang Eun Lee, Chuncheon-si (KR); Eun Ko, Seoul (KR); Yong Jae Park, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/884,916

(22) Filed: Oct. 16, 2015

(65) Prior Publication Data

US 2017/0018527 A1    Jan. 19, 2017

(30) Foreign Application Priority Data

Jul. 14, 2015   (KR) .................. 10-2015-0099942

(51) Int. Cl.
*H01L 25/065*   (2006.01)
*H01L 23/498*   (2006.01)
*H01L 23/31*    (2006.01)

(52) U.S. Cl.
CPC ...... *H01L 25/0652* (2013.01); *H01L 23/3185* (2013.01); *H01L 23/49811* (2013.01); *H01L 23/49822* (2013.01); *H01L 23/49827* (2013.01); *H01L 23/49838* (2013.01); *H01L 2224/18* (2013.01)

(58) Field of Classification Search
None
See application file for complete search history.

(56) References Cited

U.S. PATENT DOCUMENTS

| 8,263,439 | B2  |   | 9/2012 | Marimuthu et al. |
|-----------|-----|---|--------|------------------|
| 2005/0046002 | A1 | * | 3/2005 | Lee ................. H01L 21/76898 257/678 |
| 2008/0157327 | A1 |   | 7/2008 | Yang |
| 2012/0205815 | A1 | * | 8/2012 | Yang ................. H01L 25/0657 257/774 |
| 2014/0252626 | A1 | * | 9/2014 | Kang .................... H01L 24/26 257/751 |

* cited by examiner

*Primary Examiner* — Bilkis Jahan
(74) *Attorney, Agent, or Firm* — William Park & Associates Ltd.

(57) ABSTRACT

A semiconductor package may include a first semiconductor chip having a plurality of first bonding pads arranged at a first pitch on a first active surface. The semiconductor package may include one or more reconfigurable package units each including a second semiconductor chip having a plurality of second bonding pads arranged at a second pitch on a second active surface; a semiconductor chip connector arranged spaced apart from the second semiconductor chip and having a plurality of through vias arranged at the first pitch; a molding layer surrounding side surfaces of the second semiconductor chip and the semiconductor chip connector; and redistribution lines formed over the second semiconductor chip, the semiconductor chip connector, and the molding layer. The semiconductor package may include coupling members interposed between the first bonding pads of the first semiconductor chip and the through vias of the reconfigurable package unit and between the respective through vias of the stacked reconfigurable package units.

12 Claims, 6 Drawing Sheets

STACKED SEMICONDUCTOR PACKAGE INCLUDING RECONFIGURABLE PACKAGE UNITS

CROSS-REFERENCES TO RELATED APPLICATION

The present application claims priority under 35 U.S.C. §119(a) to Korean Patent Application No. 10-2015-0099942, filed on Jul. 14, 2015, in the Korean Intellectual Property Office, which is incorporated herein by reference in its entirety.

BACKGROUND

1. Technical Field

Various embodiments generally relate to a semiconductor package, and more particularly, to a semiconductor package including a plurality of semiconductor chips stacked therein.

2. Related Art

Electronic devices have often required high-capacity semiconductor chips to satisfy the large number of functions provided. As a result, efforts have been made to mount a number of semiconductor chips within electronic devices. However, the technology for fabricating high-capacity semiconductor chips, and for mounting large numbers of semiconductor chips in a limited space, has reached a limit.

Accordingly, what are needed are solutions for overcoming these and other deficiencies in the related art.

SUMMARY

In an embodiment, a semiconductor package may be provided. The semiconductor package may include a first semiconductor chip having a plurality of first bonding pads arranged at a first pitch on a first active surface. The semiconductor package may include one or more reconfigurable package units stacked over the first semiconductor chip, and each including a second semiconductor chip having a plurality of second bonding pads arranged at a second pitch different from the first pitch on a second active surface; a semiconductor chip connector or coupler arranged spaced apart from the second semiconductor chip and having a plurality of through vias arranged at the first pitch; a molding layer surrounding at least side surfaces of the second semiconductor chip and the semiconductor chip connector; and redistribution lines formed over the second semiconductor chip, the semiconductor chip connector, and the molding layer so as to electrically couple the second bonding pads and the through vias. The semiconductor package may include coupling members interposed between the first bonding pads of the first semiconductor chip and the through vias of the reconfigurable package unit and between the respective through vias of the stacked reconfigurable package units.

According to an embodiment, an electronic device may be provided. The electronic device may be, for example, a personal computer, a laptop computer, a tablet, a personal digital assistant (PDA), a mobile phone, a smart phone, or a wireless phone. The electronic device may comprise a controller, a memory coupled to the controller, an input/output device coupled to the controller, where at least one of the controller and the memory include a semiconductor package. The semiconductor package may be the semiconductor package as described above, for example.

According to an embodiment, a memory card may be provided. The memory card may comprise a memory and a memory controller coupled to the memory, where the memory includes a semiconductor package. The semiconductor package may be the semiconductor package as described above, for example.

DETAILED DESCRIPTION

Figure 1:
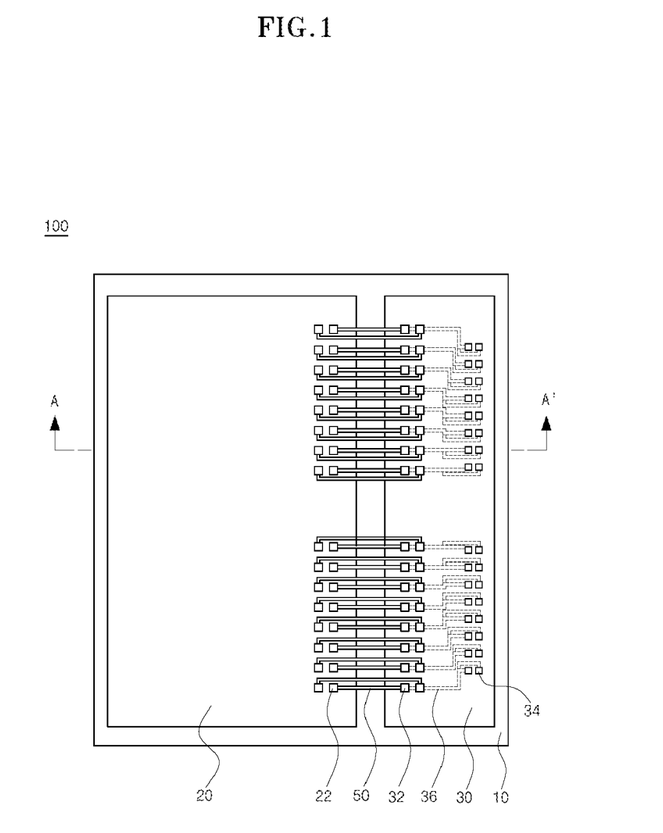
FIG. 1 is a plan view of a semiconductor package in accordance with an embodiment.
Figure 2:
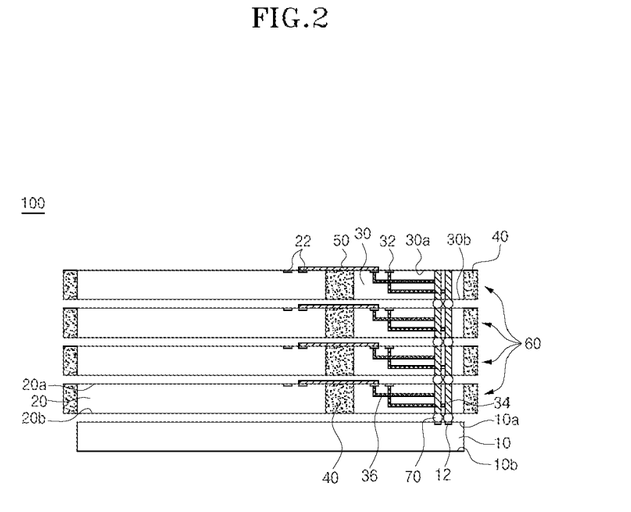
FIG. 2 is a cross-sectional view of the semiconductor package taken along line A-A' of FIG. 1.
Figure 3:
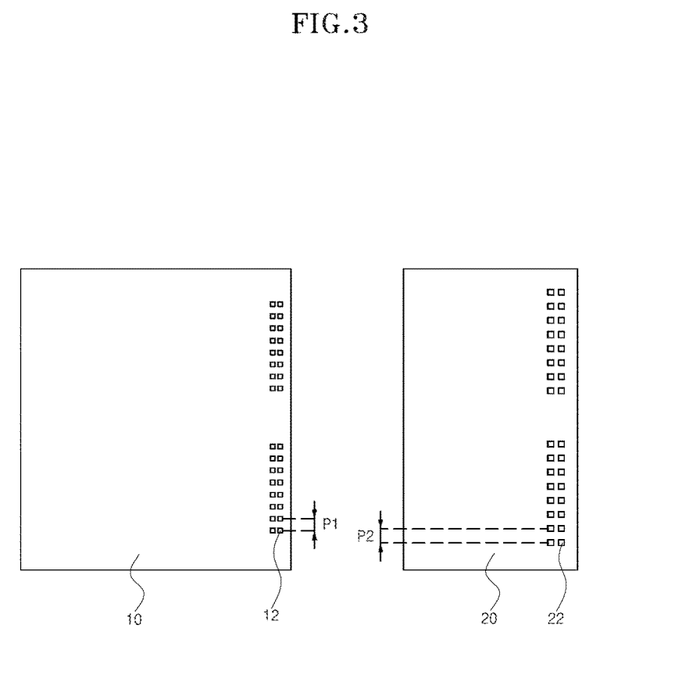
FIG. 3 is a plan view for describing the pad arrays of the semiconductor chips in the semiconductor package in accordance with the embodiment.

Referring to FIGS. 1 to 3, a semiconductor package 100 in accordance with an embodiment may include a first semiconductor chip 10, one or more reconfigurable package units 60, and coupling members 70.

The first semiconductor chip 10 may be or include a SoC (System on Chip) having various semiconductor parts, a microprocessor, and a memory mounted therein. The first semiconductor chip 10 may be formed in a rectangular plate shape as a whole, and have a first active surface 10a and a first bottom surface 10b facing the first active surface 10a. The first semiconductor chip 10 may include a plurality of first bonding pads 12 arranged on the first active surface 10a.

In the embodiment, the first bonding pads 12 may be formed at one edge of the first active surface 10a and arranged at a first pitch P1 (or distance) from each other. Furthermore, the first bonding pads 12 may be divided into two groups which are arranged spaced apart from each other. The first bonding pads 12 included in each of the groups may be arranged in two lines at one edge of the first active surface 10a.

The one or more reconfigurable package units 60 may be stacked over the first semiconductor chip 10. In the embodiment, four reconfigurable package units 60 may be stacked. Each of the reconfigurable package units 60 may include a second semiconductor chip 20, a semiconductor chip connector or coupler 30, a molding layer 40, and redistribution lines 50. The reconfigurable package units 60 may have the same cross-sectional size as the first semiconductor chip 10.

The reconfigurable package unit 60 may be for use in electrically connecting the first semiconductor chip 10 to the second semiconductor chip 20. In the reconfigurable package unit 60, the second semiconductor chip 20 may include a memory chip. The second semiconductor chip 20 may be formed in a rectangular plate shape as a whole, and have a second active surface 20a and a second bottom surface 20b facing the second active surface 20a. The second semiconductor chip 20 may include a plurality of second bonding pads 22 arranged on the second active surface 20a.

In the embodiment, the second bonding pads 22 may be formed at one edge of the second active surface 20a adjacent to the semiconductor chip connector 30, and arranged at a second pitch P2 (or distance) different from the first pitch P1. For example, the second pitch P2 may be larger than the first pitch P1. Furthermore, the second bonding pads 22 may be divided into two groups which are arranged spaced apart from each other, like the first bonding pads 12. The second bonding pads 22 included in each of the groups may be arranged in two lines.

The semiconductor chip connector 30 may be provided for electrical coupling between the first bonding pads 12 of the first semiconductor chip 10 and the second bonding pads 22 of the second semiconductor chip 20, which are arranged at different positions and pitches. The semiconductor chip connector 30 may be or be referred to as a "dummy" chip.

The semiconductor chip connector 30 may be formed in a rectangular plate shape as a whole, and have a first surface 30a corresponding to the top surface and a second surface 30b facing the first surface 30a and corresponding to the bottom surface. The semiconductor chip connector 30 may be arranged spaced apart from the second semiconductor chip 20 over the first semiconductor chip 10, and arranged in such a manner that the first surface 30a is positioned on the same plane as the second active surface 20a of the second semiconductor chip 20.

The semiconductor chip connector 30 may include coupling pads 32, through vias 34, and internal lines 36. The coupling pads 32 may be arranged at an edge of the first surface 30a adjacent to the second semiconductor chip 20. The through vias 34 may be formed passing through the first and second surfaces 30a and 30b at an edge facing the edge at which the coupling pads 32 are arranged. The through vias 34 may comprise TSVs (Through Silicon Vias). The internal lines 36 may be formed in multiple stages so as to couple the through vias 34 and the coupling pads 32 in the semiconductor chip connector 30, respectively.

In the embodiment, the numbers of the coupling pads 32, the through vias 34, and the internal lines 36 may be equal to the numbers of the first bonding pads 12 and the second bonding pads 22. In particular, the through vias 34 formed over the first bonding pads 12 may be arranged at the first pitch P1 corresponding to the pitch between the first bonding pads 12. The coupling pads 32 may arranged at the second pitch P2, the same as or similar to the second pitch P2 between the second bonding pads 22.

Although not illustrated, the semiconductor chip connector 30 may include test logic which is scarcely included in a memory chip. Furthermore, the semiconductor chip connector 30 may include a cell array block for ECC (Error Correcting Coding), and perform an ECC function of checking whether an error exists in a cell, based on a parity bit, and correcting the error. Furthermore, the semiconductor chip connector 30 may form spare TSV routing for capacity and bandwidth scaling through an extra via.

The molding layer 40 may be formed to surround at least the side surfaces of the second semiconductor chip 20 and the semiconductor chip connector 30. That is, the molding layer 40 may be formed to surround only the side surfaces of the second semiconductor chip 20 and the semiconductor chip connector 30. Furthermore, the molding layer 40 may be formed to additionally cover the second active surface 20a of the semiconductor chip 20 and the first surface 30a of the semiconductor chip connector 30. The molding layer 40 may be formed of an insulating material.

The redistribution lines 50 may be formed over the first active surface 20a of the second semiconductor chip 20, the first surface 30a of the semiconductor chip connector 30, and the molding layer 40 so as to couple the second bonding pads 22 of the second semiconductor chip 20 to the coupling pads 32 of the semiconductor chip connector 30, respectively. When the molding layer 40 is formed to cover the second active surface 20a of the second semiconductor chip 20 and the first surface 30a of the semiconductor chip connector 30, the redistribution lines 50 may be formed to be in contact with the second bonding pads 22 and the coupling pads 32 through the molding layer 40. The redistribution lines 50 may include metal lines formed of a metal such as copper.

The coupling members 70 may be interposed between the first bonding pads 12 of the first semiconductor chip 10 and the through vias 34 of the reconfigurable package units 60 arranged at the lowermost part among the stacked reconfigurable package units 60, and between the through vias 34 of the stacked reconfigurable package units 60, in order to electrically couple the first semiconductor chip 10 and the reconfigurable package units 60. The coupling members 70 may include conductive bumps.

In the embodiment, since the first bonding pads 12 of the first semiconductor chip 10 and the through vias 34 of the stacked reconfigurable package units 60 are arranged on the same vertical lines, the first bonding pads 12 and the through vias 34 may be coupled to each other through the coupling members 70. That is, since the first bonding pads 12 are arranged at the first pitch P1, the through vias 34 are also arranged at the first pitch P1, and the first bonding pads 12 and the through vias 34 are arranged at the same positions, respectively, the coupling members 70 such as conductive bumps may be interposed between the first bonding pads 12 and the through vias 34 so as to electrically couple the first bonding pads 12 to the through vias 34. As a result, the stacked first and second semiconductor chips 10 and 20 may be easily coupled to each other through the through vias 34.

Thus, in the semiconductor package in accordance with the present embodiment, the SoC and the memory chips having pads arranged at different positions and pitches may be packaged together with the semiconductor chip connectors according to the pad arrangement of the SoC. As a result, the SoC and the memory chips can be electrically coupled through the TSVs.

In particular, when the SoC and the memory chips have different pad array positions and different arrangement pitches, or when chips having no TSVs need to be stacked, the structure in which the semiconductor chip connectors having TSVs are packaged together like the semiconductor package in accordance with the present embodiment may be used to rearrange the pads using the TSVs.

In addition, since signal transmission between the SoC and the memory chips is performed through the TSVs, the signal path may be reduced. Thus, the semiconductor package in accordance with the present embodiment may have an improved driving speed, which makes it possible to implement a semiconductor product which can perform a high-speed operation.

Figure 4:
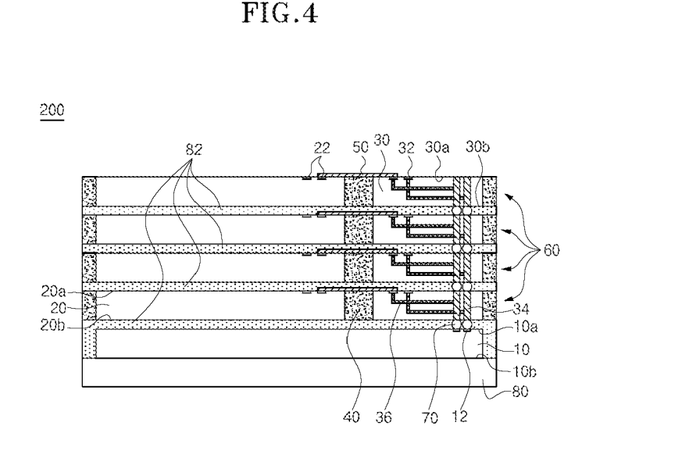
FIG. 4 is a cross-sectional view of a semiconductor package including an underfill in accordance with an embodiment.

Referring to FIG. 4, the semiconductor package 200 in accordance with the present embodiment may further include a substrate 80 arranged on the first bottom surface 10b of the first semiconductor chip 10 implemented as a SoC. The substrate 80 may include a printed circuit board. The substrate 80 may have the top surface facing the first bottom surface 10b of the first semiconductor chip 10 and the bottom surface facing the top surface.

Although not illustrated, the substrate 80 may include circuit lines, ball lands, via patterns, and solder resists. The circuit lines may include bond fingers formed on the top surface of the substrate 80. The ball lands may be formed on the bottom of the substrate 80. The via patterns may be formed in the substrate 80 so as to electrically couple the bond fingers and the ball lands, respectively. The solder resists may be formed on the top and bottom surfaces so as to expose the bond fingers and the ball lands, respectively.

Furthermore, an adhesive member may be interposed between the first semiconductor chip 10 and the substrate 80, and the first semiconductor chip 10 and the substrate 80 may electrically coupled to each other through a connection member.

The semiconductor package 200 in accordance with the present embodiment may further include an underfill 82 interposed between the first semiconductor chip 10 and the reconfigurable package unit 60 arranged at the lowermost part among the reconfigurable package units 60 and between the stacked reconfigurable package units 60. The underfill 82 may be formed to protect the first bonding pads 12 arranged on the first active surface 10a of the first semiconductor chip 10 and the second bonding pads 22, the coupling pads 32, the through vias 34, and the redistribution lines 50 of the stacked reconfigurable package units 60.

Although not illustrated, the semiconductor package 200 in accordance with the present embodiment may further include external connection terminals formed at the respective ball lands of the substrate 80. The external connection terminals may serve to mount the semiconductor package 200 on an external circuit, that is, a system board, and include solder balls.

Figure 5:
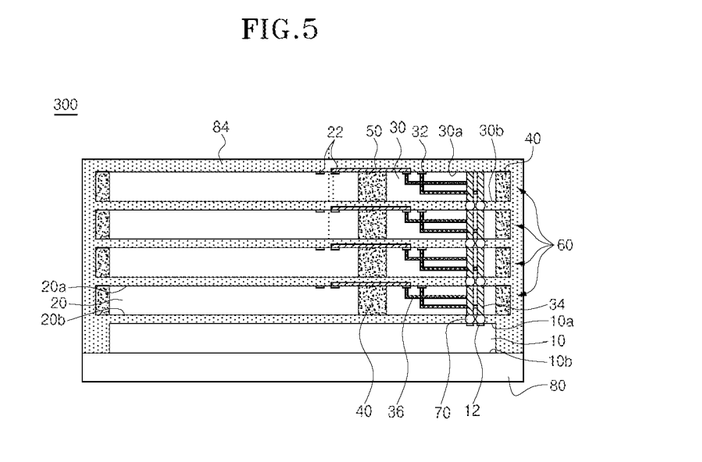
FIG. 5 is a cross-sectional view of a semiconductor package including a sealing member in accordance with an embodiment.

Referring to FIG. 5, a semiconductor package 300 in accordance with an embodiment may further include a substrate 80 arranged on the first bottom surface 10b of the first semiconductor chip 10. The substrate 80 may include a printed circuit board, and have the top surface facing the first bottom surface 10b of the first semiconductor chip 10 and the bottom surface facing the top surface.

Although not illustrated, the substrate 80 may include circuit lines, ball lands, via patterns, and solder resists. The circuit lines may include bond fingers formed on the top surface of the substrate 80. The ball lands may be formed on the bottom of the substrate 80. The via patterns may be formed in the substrate 80 so as to electrically couple the bond fingers and the ball lands, respectively. The solder resists may be formed on the top and bottom surfaces so as to expose the bond fingers and the ball lands, respectively. The substrate 80 may be attached to the first bottom surface 10b of the first semiconductor chip 10 with an adhesive member interposed therebetween. Furthermore, the substrate 80 may be electrically coupled to the first semiconductor chip 10 through a connection member.

The semiconductor package 300 in accordance with the embodiment may further include a sealing member 84 formed on the top surface of the substrate 80 so as to cover the first semiconductor chip 10 and the stacked reconfigurable package units 60. The sealing member 84 may be formed of an insulating material, for example, epoxy molding compound.

Although not illustrated, the semiconductor package 300 in accordance with the present embodiment may further include external connection terminals, such as solder balls, which are formed at the respective ball lands of the substrate 80.

Figure 6:
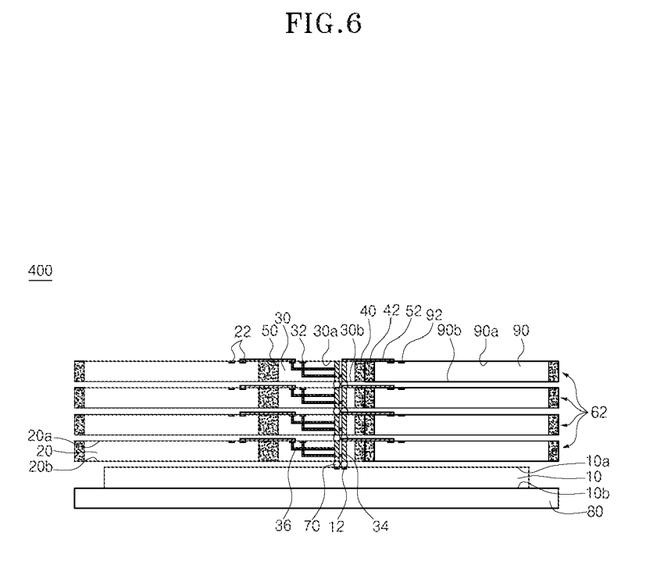
FIG. 6 is a cross-sectional view of a semiconductor package in accordance with an embodiment.

Referring to FIG. 6, a semiconductor package 400 in accordance with an embodiment may include a first semiconductor chip 10, one or more reconfigurable package units 62, and coupling members 70. The semiconductor package 400 may further include a substrate 80.

The first semiconductor chip 10 may include a SoC, and have a rectangular plate shape as a whole. The first semiconductor chip 10 may have a first active surface 10a and a first bottom surface 10b facing the first active surface 10a, and include a plurality of first bonding pads 12 arranged on the first active surface 10a. In the embodiment, the first bonding pads 12 may be formed in two lines on the center of the first active surface 10a, and arranged at the first pitch P1.

The one or more reconfigurable package units 62 may be stacked over the first semiconductor chip 10. For example, four reconfigurable package units 62 may be stacked. The reconfigurable package units 62 may have a larger size than the first semiconductor chip 10. The reconfigurable package unit 62 may include a second semiconductor chip 20, a semiconductor chip connector or coupler 30, a molding layer 40, first redistribution lines 50, a third semiconductor chip 90, an additional molding layer 42, and second redistribution lines 52.

In the reconfigurable package unit 62, the second semiconductor chip 20 may include a memory chip, and have a second active surface 20a and a second bottom surface 20b facing the second active surface 20a. The second semiconductor chip 20 may include a plurality of second bonding pads 22 arranged on the second active surface 20a. The second bonding pads 22 may be formed at an edge of the second active surface 20a adjacent to the semiconductor chip connector 30, and arranged at a second pitch P2 different from the first pitch P1.

The semiconductor chip connector 30 may have a first surface 30a and a second surface 30b facing the first surface 30a. The semiconductor chip connector 30 may be arranged spaced apart from the second semiconductor chip 20 over the first semiconductor chip 10, and arranged in such a manner that the first surface 30a is positioned on the same plane as the second active surface 20a of the second semiconductor chip 20. The semiconductor chip connector 30 may include coupling pads 32, through vias 34, and internal lines 36. The through vias 34 may comprise TSVs (Through Silicon Vias).

The coupling pads 32 may be arranged at an edge of the first surface 30a adjacent to the second semiconductor chip 20, and the through vias 34 may be formed through the first and second surfaces 30a and 30b at an edge facing the edge at which the coupling pads 32 are arranged. The internal lines 36 may be formed in multiple stages in the semiconductor chip connector 30 so as to couple the through vias 34 and the coupling pads 32. The through vias 34 formed over the first bonding pads 12 may be arranged at the first pitch P1 corresponding to the pitch between the first bonding pads 12.

The molding layer 40 may be formed to surround at least the side surfaces of the second semiconductor chip 20 and the semiconductor chip connector 30. The molding layer 40 may be formed to additionally cover the second active surface 20a of the second semiconductor chip 20 and the first surface 30a of the semiconductor chip connector 30.

The first redistribution lines 50 may be formed on the second active surface 20a of the second semiconductor chip 20, the first surface 30a of the semiconductor chip connector 30, and the molding layer 40, and couple the second bonding pads 22 of the second semiconductor chip 20 to the coupling pads 32 of the semiconductor chip connector 30, respectively. When the molding layer 40 is formed to cover the second active surface 20a of the second semiconductor chip 20 and the first surface 30a of the semiconductor chip connector 30, the first redistribution lines 50 may be formed to be in contact with the second bonding pads 22 and the coupling pads 32 through the molding layer 40. The first redistribution lines 50 may include metal lines.

The third semiconductor chip 90 may include a memory chip, and have a rectangular plate shape as a whole. The third semiconductor chip 90 may have a third active surface 90a and a third bottom surface 90b facing the third active surface 90a. The third semiconductor chip 90 may be arranged in such a manner that the third active surface 90a is positioned on the same plane as the second active surface of the second semiconductor chip 20 and the first surface 30a of the semiconductor chip connector 30. The third semiconductor chip 90 may include a plurality of third bonding pads 92 arranged on the third active surface 90a. The third bonding pads 92 may be formed at an edge of the third active surface 90a adjacent to the semiconductor chip connector 30, and arranged at a second pitch P2 different from the first pitch P1.

The additional molding layer 42 may be formed to surround at least the side surface of the third semiconductor chip 90 while being in contact with the first molding layer 40. The additional molding layer 42 may be formed of the same insulating material as the first molding layer 40. The additional molding layer 42 may be formed to further cover the third active surface 90a of the third semiconductor chip 90.

The second redistribution lines 52 may be formed on the third active surface 90a, the first surface 30a, the molding layers 40, and the additional molding layer 42 so as to couple the third bonding pads 92 of the third semiconductor chip 90 to the through vias 34 of the semiconductor chip connector 30, respectively. The second redistribution line 52 may include a metal line formed of the same metal as the first redistribution line 50, for example, copper.

The coupling members 70 may be interposed between the first bonding pads 12 of the first semiconductor chip 10 and the through vias 34 of the reconfigurable package unit 62 arranged at the lowermost part among the stacked reconfigurable package units 62, and between the respective through vias 34 of the stacked reconfigurable package units 62. The coupling members 70 may include conductive bumps.

The substrate 80 may include a printed circuit board. The substrate 80 may be arranged to face the first bottom surface 10b of the first semiconductor chip 10. The substrate 80 may have the top surface facing the first bottom surface 10b of the first semiconductor chip 10 and the bottom surface facing the top surface. Although not illustrated, the substrate 80 may include circuit lines, ball lands, via patterns, and solder resists. The circuit lines may include bond fingers formed on the top surface of the substrate 80. The ball lands may be formed on the bottom of the substrate 80. The via patterns may be formed in the substrate 80 so as to electrically couple the bond fingers and the ball lands. The solder resists may be formed on the top and bottom surfaces so as to expose the bond fingers and the ball lands, respectively.

Although not illustrated, the semiconductor package 400 in accordance with the embodiment may further include an underfill interposed between the first semiconductor chip 10 and the reconfigurable package unit 62 arranged at the lowermost part among the stacked reconfigurable package units 62 and between the stacked reconfigurable package units 62. In another embodiment, the semiconductor package 400 may further include a sealing member formed on the top surface of the substrate 80 so as to cover the first semiconductor chip 10 and the stacked reconfigurable package units 62.

Although not illustrated, the semiconductor package 400 in accordance with the present embodiment may further include external connection terminals, such as solder balls, which are formed at the respective ball lands of the substrate 80.

The above-described semiconductor package may be applied to various types of semiconductor devices and package modules including the same.

Figure 7:
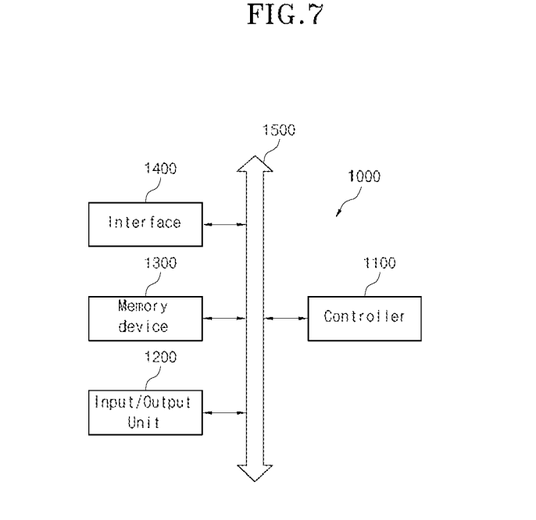
FIG. 7 is a block diagram of an electronic system to which the semiconductor package in accordance with the various embodiments are applied.

FIG. 7 is a block diagram of an electronic system to which semiconductor packages in accordance with the various embodiments are applied.

As illustrated in FIG. 7, the electronic system 1000 may include a controller 1100, an input/output unit 1200, and a memory device 1300. The controller 1100, the input/output unit 1200, and the memory device 1300 may be coupled to each other through a bus 1500 to provide a path through which data are transmitted.

For example, the controller 1100 may include one or more of a microprocessor, a digital signal processor, a microcontroller, and logical elements capable of performing similar functions. The controller 1100 and the memory device 1300 may include semiconductor packages in accordance with the various embodiments. The input/output unit 1200 may include one or more units selected from a key pad, a keyboard, and a display device.

The memory device 1300 may store data and/or commands executed by the controller 1100. The memory device 1300 may include a volatile memory device such as DRAM and/or a nonvolatile memory device such as flash memory. For example, the flash memory may be mounted in an information processing system such as a mobile device or desk top computer. Such a flash memory may include an SSD (Solid State Drive). In this case, the electronic system 1000 may stably store a large volume of data in the flash memory system.

The electronic system 1000 may further include an interface 1400 for transmitting data to a communication network or receiving data from the communication network. The interface 1400 may be configured in a wireless or wired manner. For example, the interface 1400 may include an antenna or wired/wireless transceiver. Although not illustrated, the electronic system 1000 may further include an application chip set, a camera image processor, and an input/output unit.

The electronic system 1000 may include a mobile system, a personal computer, an industrial computer, or a logic system which performs various functions. For example, the mobile system may include any one of a PDA (Personal Digital Assistant), a portable computer, a web tablet, a mobile phone, a smart phone, a wireless phone, a laptop computer, a memory card, a digital music system, and an information transmitting/receiving system.

Figure 8:
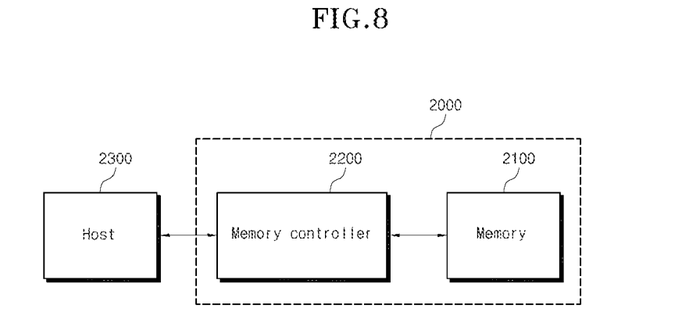
FIG. 8 is a block diagram of a memory card including the semiconductor package in accordance with the various embodiments.

When the electronic system 1000 can perform wireless communication, the electronic system 1000 may be used for a communication system such as CDMA (Code Division Multiple Access), GSM (Global System for Mobile communication), NADC (North American Digital Cellular), E-TDMA (Enhanced-Time Division Multiple Access), WCDMA (Wideband Code Division Multiple Access), CDMA2000, LTE (Long Term Evolution), or Wibro (Wireless Broadband Internet). FIG. 8 is a block diagram of a memory card including the semiconductor packages in accordance with the various embodiments. As illustrated in FIG. 8, the semiconductor packages in accordance with the various embodiments may be provided in the form of a memory card 2000. For example, the memory card 2000 may include a memory 2100 such as a nonvolatile memory element and a memory controller 2200. The memory 2100 and the memory controller 2200 may store data or read stored data. The memory 2100 may include one or more of nonvolatile memory devices to which the semiconductor packages in accordance with the various embodiments are applied. The memory controller 2200 may control the memory 2100 to read stored data or store data in response to a read/write request of the host 2300. While various embodiments have been described above, it will be understood to those skilled in the art that the embodiments described are by way of example only. Accordingly, the semiconductor package described herein should not be limited based on the described embodiments. The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

The invention claimed is:

1. A semiconductor package, comprising:
  a first semiconductor chip having a plurality of first bonding pads arranged at a first pitch on a first active surface;
  one or more reconfigurable package units stacked over the first semiconductor chip, each comprising:
    a second semiconductor chip having a plurality of second bonding pads arranged at a second pitch different from the first pitch on a second active surface;
    a semiconductor chip connector arranged spaced apart from the second semiconductor chip and having a plurality of through vias arranged at the first pitch;
    a molding layer surrounding at least side surfaces of the second semiconductor chip and the semiconductor chip connector; and
    redistribution lines, extending from second bonding pads over the molding layer to coupling pads, formed over the second semiconductor chip, the semiconductor chip connector, and the molding layer so as to electrically couple the second bonding pads and the through vias; and
  coupling members interposed between the first bonding pads of the first semiconductor chip and the through vias of the reconfigurable package unit and between the respective through vias of the stacked reconfigurable package units.

2. The semiconductor package of claim 1, wherein the first semiconductor chip comprises a SoC (System on Chip), and the second semiconductor chip comprises a memory chip.

3. The semiconductor package of claim 1, wherein the first semiconductor chip and the reconfigurable package unit have a similar cross-sectional size to each other.

4. The semiconductor package of claim 1, wherein the first bonding pads of the first semiconductor chip are arranged on the first active surface under the through vias of the semiconductor chip connector.

5. The semiconductor package of claim 1, wherein the second bonding pads of the second semiconductor chip are arranged at an edge of the second active surface adjacent to the semiconductor chip connector.

6. The semiconductor package of claim 1, wherein the semiconductor chip connector has a first surface, a second surface facing the first surface, the coupling pads arranged on the first surface and coupled to the redistribution lines, and internal lines formed therein so as to couple the coupling pads and the through vias, respectively.

7. The semiconductor package of claim 6, wherein the coupling pads are arranged at an edge of the first surface of the semiconductor chip connector, the edge being adjacent to the second semiconductor chip, and the through vias are arranged at an edge facing the edge at which the coupling pads are arranged.

8. The semiconductor package of claim 6, wherein the first bonding pads, the second bonding pads, the coupling pads, and the through vias are arranged in two lines, respectively, and the internal lines are formed in multiple stages in the semiconductor chip connector.

9. The semiconductor package of claim 1, wherein the molding layer is formed of an insulating material.

10. The semiconductor package of claim 1, wherein the molding layer is formed to expose the second surfaces of the second semiconductor chip and the semiconductor chip connector.

11. The semiconductor package of claim 1, wherein the coupling members comprise conductive bumps.

12. The semiconductor package of claim 1, further comprising a substrate arranged on a first bottom surface of the first semiconductor chip, having a top surface facing the first bottom surface of the first semiconductor chip and a bottom surface facing the top surface, and electrically coupled to the first semiconductor chip.

* * * * *